US 6,680,965 B2

(12) United States Patent
Kinoshita (10) Patent No.: US 6,680,965 B2
(45) Date of Patent: Jan. 20, 2004

(54) SEMICONDUCTOR LASER DIODE AND OPTICAL COMMUNICATION SYSTEM (75) Inventor: Junichi Kinoshita, Grove, IL (US)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 10/057,310

(22) Filed: Jan. 25, 2002

(65) Prior Publication Data

US 2002/0114369 A1 Aug. 22, 2002

(30) Foreign Application Priority Data

Jan. 26, 2001 (JP) .......................... 2001-018901

(51) Int. Cl.[7] ................................................ H01S 5/83
(52) U.S. Cl. ........................................................ 372/96
(58) Field of Search ............................................ 372/96

(56) References Cited

U.S. PATENT DOCUMENTS

6,330,265 B1  12/2001  Kinoshita .................... 372/50

Primary Examiner—James Davie
(74) Attorney, Agent, or Firm—Hogan & Hartson, LLP (57) ABSTRACT A surface emitting laser that provides an improved temperature characteristic, an improved optical output, and easy forming process. An optical communication system using this surface emitting laser is also provided. A surface emitting laser comprising: a substrate; a vertical cavity of layers formed on said substrate for propagating and resonating light along an axis vertical to a surface of said substrate, said light emitted from an active layer by current injection; and a reflective film disposed concentrically with the vertical axis around the outer periphery of said vertical cavity for reflecting the light from said active layer in a horizontal direction parallel to the surface of said substrate, the light emitted from said active layer forming a laser beam due to resonation, which laser beam is then emitted in a vertical direction. An optical communication system using the surface emitting laser.

20 Claims, 6 Drawing Sheets

SEMICONDUCTOR LASER DIODE AND OPTICAL COMMUNICATION SYSTEM

CROSS-REFERENCE TO RELATED APPLICATIONS

This application is based upon and claims the benefits of priority from the prior Japanese Patent Application No. 2001-018901, filed on Jan. 26, 2001, the entire contents of which are incorporated herein by reference.

BACKGROUND OF THE INVENTION

1. Field of the Invention

The present invention relates generally to a semiconductor laser diode and an optical communication system.

2. Related Background Art

Various light elements such as light emitting elements, photodetectors and light modulating elements are used in an extensive field and placed as basic devices that support an information technology society. Among those light elements, the semiconductor lasers exhibit a narrow spectrum of light emissions, are coherent and can focus light energy of an extremely high density on a small area. Thus, the semiconductor lasers have found applications in various fields such as optical communication, medical care, display devices reading/writing from/to optical discs, etc.

In the above semiconductor lasers, many edge emitting lasers that emit laser beams parallel to substrates thereof are used. Surface emitting lasers that emit laser beams vertical to the substrates thereof are also used. Since the surface emitting lasers involve surface emissions, they are suitable for being constituted as two-dimensional arrays and also for coupling to optical fibers.

Vertical cavity surface emitting lasers (VCSELs) that have laser cavities extending vertical to the substrates thereof have a merit that they operate at a low threshold current, and they have been greatly studied recently. The VCSELs, however, have a drawback that they exhibit no excellent high-temperature characteristic and provide a low optical output although they operate at a low threshold current.

SUMMERY OF THE INVENTION

According to embodiments of the present invention, there is provided a surface emitting laser comprising:
a surface emitting laser comprising:
a substrate;
a vertical cavity of layers formed on said substrate for propagating and resonating light along an axis vertical to a surface of said substrate, said light emitted from an active layer by current injection; and
a reflective film disposed concentrically with the vertical axis around the outer periphery of said vertical cavity for reflecting the light from said active layer in a horizontal direction parallel to the surface of said substrate,
the light emitted from said active layer forming a laser beam due to resonation, which laser beam is then emitted in a vertical direction.

According to embodiments of the present invention, there is provided an optical communication system comprising:
An optical communication system comprising:
a surface emitting laser comprising: a substrate; a vertical cavity of layers formed on said substrate for propagating and resonating light along an axis vertical to a surface of said substrate, said light emitted from an active layer by current injection; and a reflective film disposed concentrically with the vertical axis around the outer periphery of said vertical cavity for reflecting the light from said active layer in a horizontal direction parallel to the surface of said substrate, the light emitted from said active layer forming a laser beam due to resonation and being emitted in a vertical direction;
an optical fiber for transmitting the laser beam from said surface emitting laser therethrough; and
a photodetector for receiving the laser beam from said optical fiber and for converting the laser beam to an electrical current.

According to embodiments of the present invention, there is further provided a surface emitting laser comprising:
a substrate;
a first DBR formed on said substrate and taking the form of a cylinder having a central axis vertical to a surface of said substrate and exhibiting a high reflectivity to light having a wavelength of $\lambda$;
a first conductive type cladding layer formed on an overall surface of said first DBR;
an active layer formed on an overall surface of said first conductive type cladding layer for emitting light having a wavelength of $\lambda$ by current injection;
a second conductive type cladding layer formed on an overall surface of said active layer;
a second DBR taking the form of a cylinder formed on said second conductive type cladding layer and smaller in radius than said first DBR, said second DBR having the same central axis as said second conductive type cladding layer, said second DBR exhibiting a high reflectivity to the light having a wavelength of $\lambda$;
said first DBR, said first conductive type cladding layer, said active layer, said second conductive type cladding layer, and said second DBR composing a vertical cavity;
a burying layer of a second conductive type formed on said second conductive type cladding layer around the outer periphery of said second DBR, said burying layer exhibiting a lower refractive index than said second DBR;
a reflective film covering the outer peripheries of said first DBR, said first conductive type cladding layer, said active layer, said second conductive type cladding layer, and said burying layer, said reflective film exhibiting a high reflectivity to the light having a wavelength of $\lambda$;
the light from said active layer are resonated in a horizontal direction due to reflection of the light by said reflective film and focused in the vicinity of said central axis, the focused light are also resonated in a vertical direction by said vertical cavity to thereby form a laser beam, which is then extractable in the vertical direction from said second DBR.

According to embodiments of the present invention, there is further provided a surface emitting laser comprising:
a substrate;
a cylindrical vertical cavity waveguide formed on said substrate and having a central axis vertical to said substrate, said waveguide comprising a lamination of alternate layers of different refractive indexes for causing light having a wavelength of $\lambda$ to resonate in a vertical direction;
a cladding layer formed around the outer periphery of said vertical cavity waveguide on said substrate, said cladding layer exhibiting a smaller refractive index than an average refractive index of said vertical cavity waveguide;
a conductive area formed around the outer periphery of said cladding layer on said substrate, said conductive area comprising a first conductive type cladding layer, an active layer formed on said first conductive type cladding layer for emitting light having a wavelength of λ by current injection, and a second conductive type cladding layer formed on said active layer;

a reflective film covering the outer periphery of said conductive area and exhibiting a high reflectivity to the light having a wavelength of λ;

the light from said active layer are resonated in a horizontal direction and also in a vertical direction by said vertical cavity to thereby form a laser beam, which is then extractable in the vertical direction from said vertical cavity waveguide.

DETAILED DESCRIPTION OF THE INVENTION

Surface emitting lasers according to the embodiments of the present invention and their optical communication systems will be described with reference to the accompanying drawings.

Figure 6:
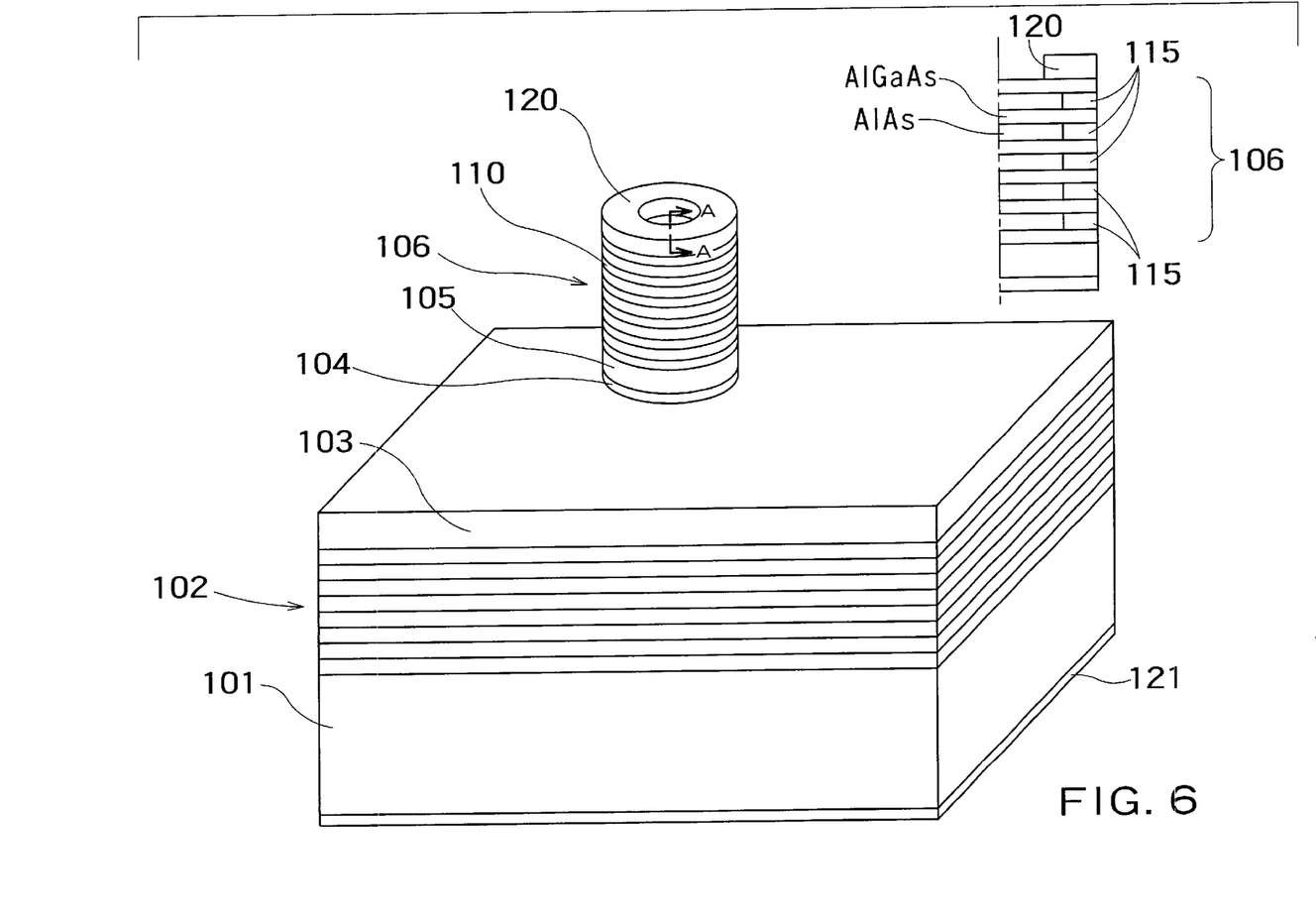
FIG. 6 is a schematic perspective view of a VCSEL structure made experimentally by the inventor in a course to the present invention.

Referring to FIG. 6, a VCSEL made experimentally by the inventor will be described as a premise of the present invention. The VCSEL of FIG. 6 is made of GaAlAs/GaAs materials and oscillates at a 860 nm wavelength. A structure of the VCSEL will be outlined in its making process as follows.

First, a lower DBR (Distributed Bragg Reflector) 102 composed of alternate layers of AlGaAs and AlAs is grown on an n-type GaAs substrate 101. Then, formed on the lower DBR 102 are an n-type AlGaAs cladding layer 103, GaAs active layer 104, a p-type AlGaAs cladding layer 105, and an upper DBR 106 comprising a lamination of alternate layers of p-type AlGa and AlAs.

Then, this product is etched out downward to the lower DBR 102 to form a vertical cavity (a cylindrical mesa) 110. The cylindrical mesa 110 is then subjected to a vapor oxidizing process on its side to thereby form Al oxide layers (insulators) 115 in the vicinity of an exposed mesa side of the AlAs layers of the upper DBR. By limiting the formation of the oxide layers 115 due to the Al oxidation so as to leave a more central part of the wall of the cylindrical mesa 110, a structure having a narrow central current path to the active layer 104 is provided.

A p-side ring-like electrode 120 is formed on top of the mesa 110 so that light are extracted from the central opening in the upper surface of the mesa. An n-side electrode 121 is formed on the back of the substrate 101. Thus, the VCSEL of FIG. 6 is completed.

In the VCSEL of FIG. 6, a threshold current is small. However, in the VCSEL of FIG. 6, the current is focused on a very small active layer volume, and the VCSEL exhibits a bad high-temperature characteristic and cannot provide large optical output. Since the active layer into which a current is to be injected is placed below the light extracting surface, a very narrow ring-like electrode and an internal narrow current limiting structure formed, for example, by selective oxidation are needed. The narrow ring-like electrode will increase contact resistance. High contact resistance and high current resistance (narrow current path) will lead to a further deterioration in the temperature characteristic. With the FIG. 6 structure, the p-side electrode 120 should be formed with high positional precision on top of the thin cylindrical mesa 110 so as not to interrupt the laser beam concerned and care must be taken to form the thin films and at PEP process.

Keeping in mind the FIG. 6 VICSEL, just described above, the embodiments of the present invention will be described next in which a first and a second embodiment each involves a surface emitting laser and a third embodiment involves an optical communication system using the surface emitting laser.

(First Embodiment)

Figure 1:
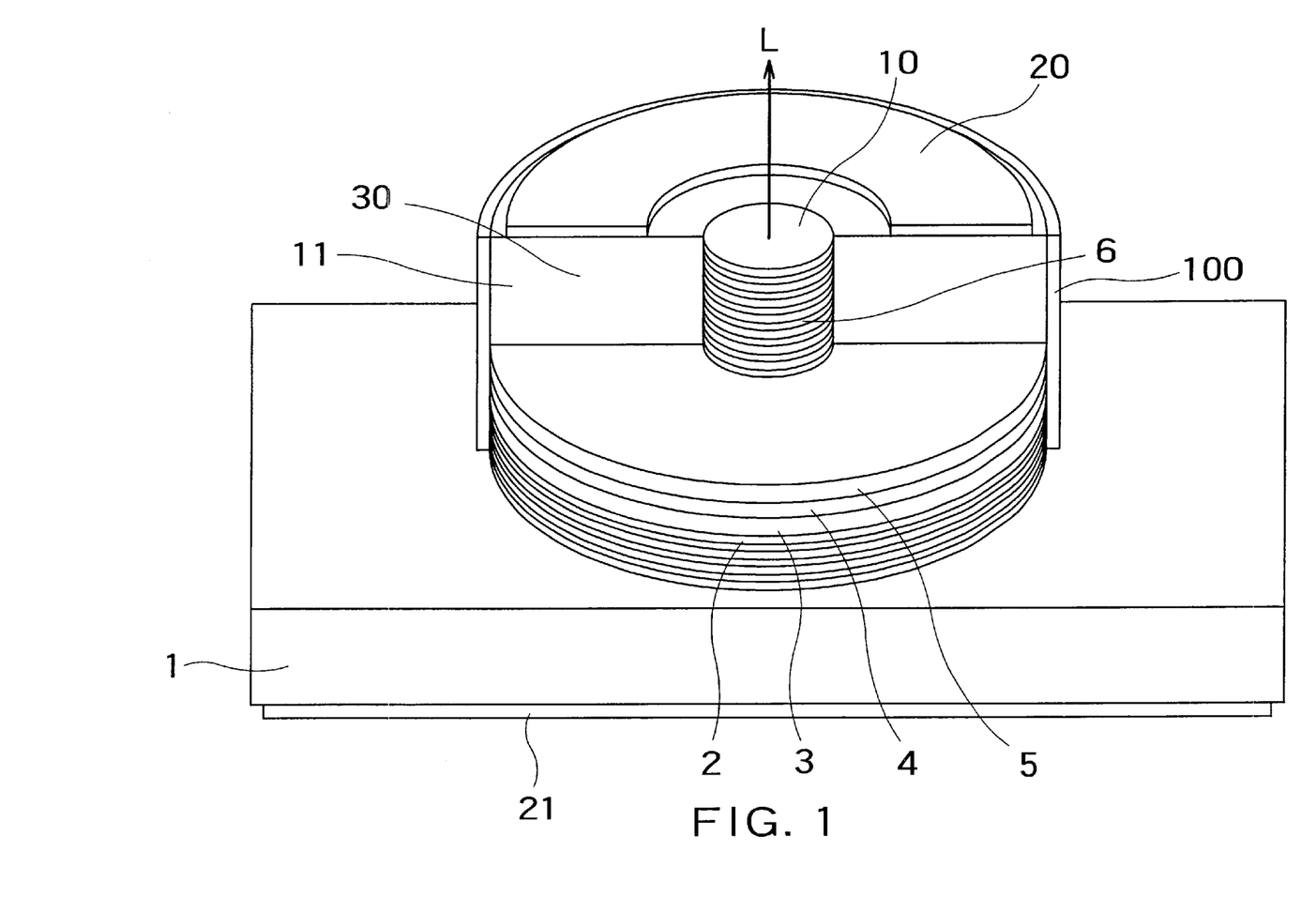
FIG. 1 is a schematic perspective view of a surface emitting laser according to a first embodiment of the present invention.

As will be seen in FIG. 1, one of the features of the surface emitting laser of the first embodiment in that light emitted from the active layer 4 are cross resonated based on vertical resonation by vertical cavities 2–6 and horizontal resonation by a reflective film 100 so as to provide a strong laser beam in a direction of a vertical axis L of the laser.

FIG. 1 is a schematic perspective view of a surface emitting laser in the first embodiment. The FIG. 1 laser is made of GaAlAs/GaAs materials and oscillates at a wavelength of λ, which is 860 nm. A lower or first DBR 2 comprising alternate layers of AlGaAs and AlAs, an n-type AlGaAs cladding layer 3, a GaAs active layer 4, a p-type AlGaAs cladding layer 5, and an upper or second DBR 6 comprising alternate layers of p-type AlGaAs and AlAs, formed in this order on an n-type GaAs substrate 1 with a common central axis L vertical to a surface of the substrate. The lower and upper DBRs 2 and 6 each exhibit a high reflectivity to light having a wavelength of λ emitted from the active layer 4. Therefore, the lower DBR 2, n-type cladding layer 3, active layer 4, p-type cladding layer 5 and upper DBR 6 constitute a vertical cavity that causes light emitted from the active layer 4 by current injection to propagate and resonate along the axis L. A cylindrical mesa 10 is formed so as to cover the upper DBR 6 and a part of the thickness of the p-type AlGaAs cladding layer 5. The cylindrical mesa 10 has a smaller radius than the lower DBR around the common central axis L. The mesa 10 is buried in a grown GaAs burying layer 30. The composition of the GaAs burying layer 30 is adjusted so as to be lower in refractive index than the upper DBR 6. The burying layer 30 is etched out so as to provide a large cylindrical mesa 11. The cylindrical mesa 11, lower DBR 2, n-type cladding layer 3, active layer 4, p-type cladding layer 5 and burying layer 30 are covered on their outer peripheries with a high reflection insulator film 100, which exhibits a high reflectivity to light having a wavelength of λ from the active layer 4. The p-side ring-like electrode 20 is provided on top of the burying layer 30 that constitutes a part of the cylindrical mesa 11. An n-side electrode 21 is provided on the back of the substrate 1.

When a forward voltage is applied across the electrodes 20 and 21 to the pn-junction of the surface emitting laser of FIG. 1, a current is injected into the active layer 4 to cause the active layer 4 to emit light having a wavelength of λ from the overall surface of the active layer 4. The light from the active layer 4 are reflected by the high reflection film 100 so that resonation occurs in a horizontal direction parallel to a surface of the substrate 1, and focussed in the vicinity of the vertical axis L. More specifically, when the high reflection film 100 around the outer periphery of the mesa has a reflectivity high to some extent, the Q of resonation in the radius, horizontal direction of the cylinder increases to focus the light in the vicinity of the central axis L. These focussed light are also resonated in a vertical direction by the vertical cavities 2–6. That is, in the surface emitting laser of FIG. 1, "cross resonation"occurs due to resonations in the radius vector or horizontal direction and in the vertical direction of the cylindrical mesa 11. Strong light obtained by this resonation can be extracted in the vertical axis L direction from an opening in the upper surface of the DBR 6.

Since the light element of the present embodiment operating based on the above-mentioned mechanism has a larger volume of the active layer 4 than the VICSEL of FIG. 6, it exhibits a good temperature characteristic and provides high optical output.

The ring-like p-side electrode 20 has a larger size than that of the FIG. 6 VCSEL to thereby greatly reduce the contact resistance. The p-side electrode 20 can be provided with a less strict positional accuracy on the top of the thicker cylindrical mesa 11.

Although not shown, one of a pair of ring-like subelectrodes may be disposed substantially concentrically in the mesa instead of the single ring-like electrode 20 so that any one of the pair of subelectrodes may adjust a phase of light reflected by the outer periphery of the cylindrical mesa 11 under resonation in the radius vector direction. The pair of subelectrodes is similar in structure to that of FIG. 3 to be described later.

(Second Embodiment)

Figure 2:
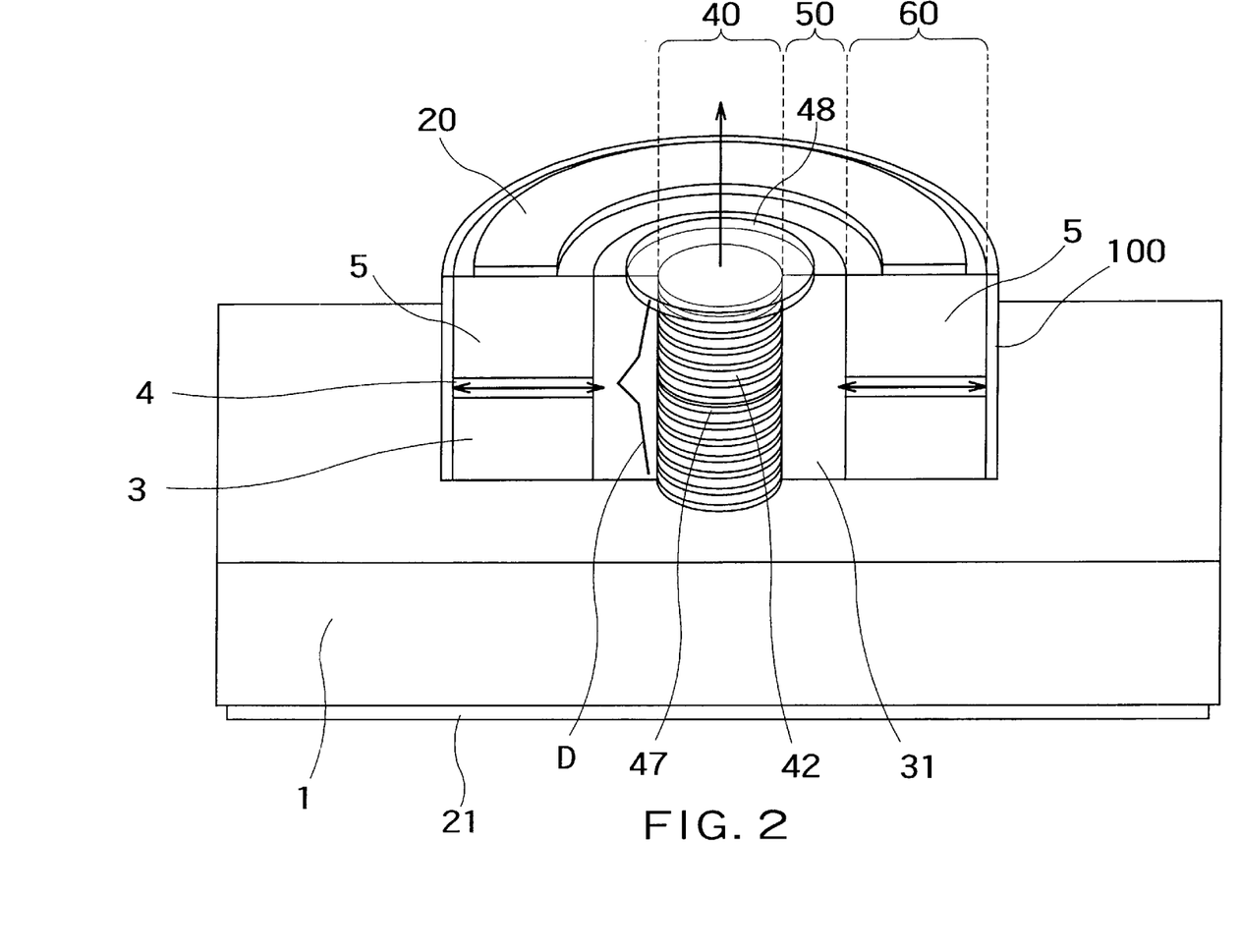
FIG. 2 is a schematic perspective view of a surface emitting laser according to a second embodiment of the present invention.

As will be seen in FIG. 2, the surface emitting laser of the second embodiment has a current injection area 60 and a waveguide area 40 that are concentrically disposed and separated spatially from each other.

FIG. 2 is a schematic perspective view of the surface emitting laser of the second embodiment. Provided on an n-type GaAs substrate 1 are a vertical cylindrical cavity waveguide 40 having an axis L vertical to the surface of the substrate 1, a cladding layer 50 formed around the outer periphery of the waveguide 40 and a conductive area 60 formed around the outer periphery of the cladding layer 50. The waveguide 40 formed at the center of the laser has a periodic structure 42 that causes second-order Bragg refraction. More specifically, the periodic structure 42 may comprise a lamination of alternate layers of different optical characteristics so as to cause light having a wavelength of λ to cause second-order refraction. A λ/4 phase sifter 47 is provided in the vicinity of the midpoint of the length of the periodic structure 42 where λ represents a resonation wavelength. The periodic structure 42 may be a crystal lamination, for example, of alternate layers of AlGaAs and AlAs or alternate insulator layers of $SiO_2$ and $TiO_2$. The cladding layer 50 having a smaller refractive index than an average refractive index of the waveguide 40 is provided around the outer periphery of the cavity waveguide 40 to thereby form a cylindrical mesa. Provided concentrically around the outer periphery of the cladding layer 50 is the current area 60 comprising a lamination of an n-type AlGaAs cladding layer 3, an active layer 4 and a p-type AlGaAs layer 5. The height of the active layer 4 from the substrate 1 is adjusted so that the active layer 4 is flush with the phase shifter 47 of the periodic structure 42 because a radiation mode intensity in the phase shifter 47 is large. (Radiation mode is defined as light emission normal to the guided mode via the second-order periodic structure.) In FIG. 2, reference character D denotes an intensity distribution of a radiation mode radiated from the periodic structure 42. As shown by the reference character D, the intensity of the radiation mode has a peak at the phase shifter 47. A high reflection film 100, for example, made of an insulator is provided around the outer periphery of the conductive area 60. A p-side ring-like electrode 20 is provided on top of the conductive area 60 whereas an n-side electrode 21 is provided on the back of the substrate 1.

When a bias is applied across the electrodes 20 and 21 to the surface emitting laser of FIG. 2, the surface emitting laser emits light in the active layer 4 of the conductive area 60, the light going and radially returning within the active layer 4 as a result of reflection by the high reflection film 100, as shown by a double-headed arrow in the vicinity of the active layer 4 of FIG. 2. When the reflectivity of the outer high reflection film 100 is high to some extent, the Q of resonation in the radius vector of the cylindrical mesa increases, and the light is coupled to a radiation mode from the vertical cavity waveguide 40 to resonate at the position of the phase shifter 47 within the vertical cavity waveguide 40. The resonating light is extracted as output from the upper surface of the waveguide 40. That is, also in this embodiment, "cross resonation"occurs based on resonations in the radius vector direction and in the vertical direction of the cylindrical mesa.

The present embodiment utilizes coupling via the radiation mode of the vertical cavity waveguide 40. The waveguide 40 has a DFB (Distributed FeedBack) structure, so that an AR (Anti-Reflection) film 48 that suppresses reflection is preferably provided on the light output surface.

The surface emitting laser of this embodiment has a similar concept to that of the invention disclosed in a prior Japanese Patent Application No. Hei 10-314842. The present embodiment is unique in that the waveguide is a "vertical cavity type"and the gain/loss area is not unidirectional, but circulative around the waveguide.

Also, in the surface emitting laser of this embodiment the active layer is far greater in volume than that of the VCSEL of FIG. 6 to thereby provide an excellent temperature characteristic and a greatly increased optical output. Especially, in this embodiment, the waveguide less in temperature change is separated from the conductive area more in temperature change. This further improves the stability of the wavelength.

The p-side ring-like electrode 20 is formed so as to have a wide contact area on top of the current-injection area 60 that has enough width. Thus, the contact resistance is reduced and may be formed with a rough accuracy to thereby facilitate the manufacture of the electrodes.

With the surface emitting laser of FIG. 2, the c area 60 is completely separated from the waveguide area 40, so that the freedom of the element design increases, advantageously.

(Modification)

Figure 3:
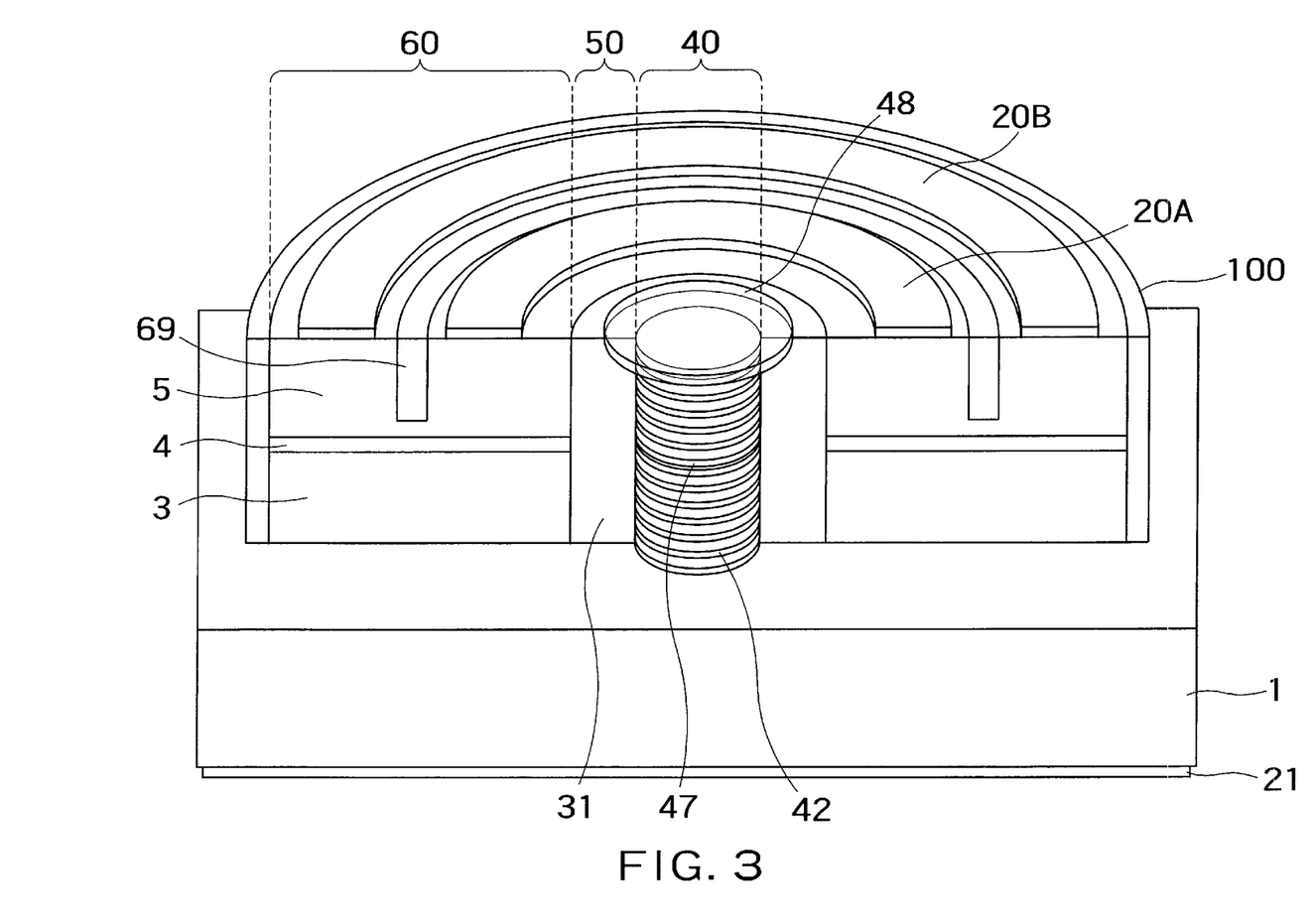
FIG. 3 is a schematic perspective view of a surface emitting laser as a modification of the second embodiment.

FIG. 3 is a schematic perspective view of a modification of the surface emitting laser of the second embodiment. In the laser of FIG. 3, a p-side ring-like electrode provided on top of the conductive current-injection area 60 is composed of a pair of substantially concentric subelectrodes 20A and 20B. By adjusting a balance between a pair of bias voltages each applied to a respective one of the pair of subelectrode 20A and 20B, the phase of light reflected by the outer periphery of the laser due to resonation in the radius vector direction can be adjusted. A hollow cylindrical high resistance area 69 is formed between the pair of ring-like subelectrodes 20A and 20B for electrically insulating purposes. The high resistance area 69 may be formed, for example, by injecting proton ions into the conductive area 60.

As another modification, the periodic structure 42 in the FIG. 2 or 3 laser may be formed so as to have optically asymmetrical characteristics with reference to a mid-horizontal line.

Figure 4:
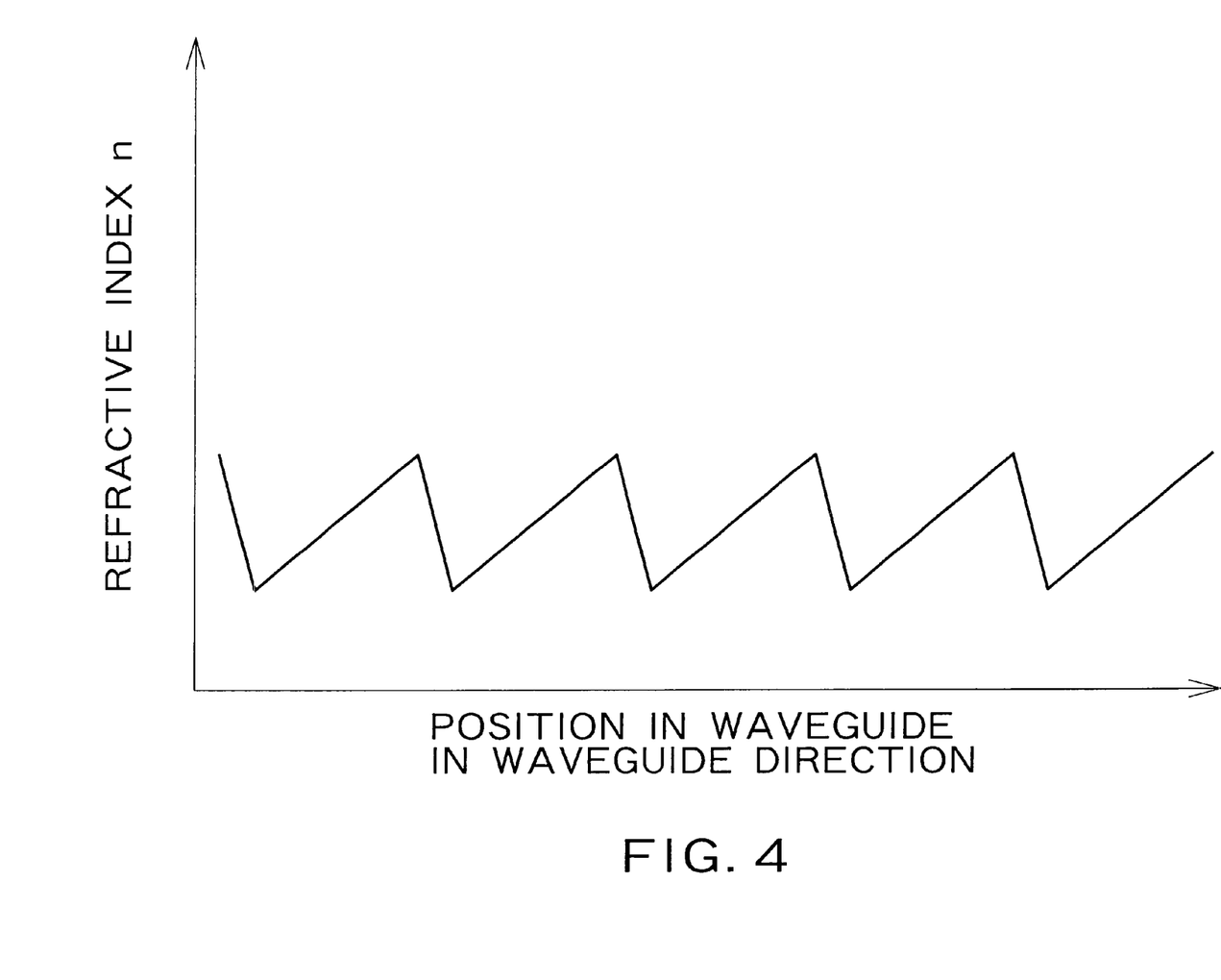
FIG. 4 is a graph illustrating an asymmetrically formed distribution of refractive indexes in a periodic al structure 42.

FIG. 4 is a graph illustrating an asymmetrical distribution of refractive indexes in the periodic structure 42. In FIG. 4, the horizontal axis represents a position in the periodic structure 42 in the waveguide direction whereas the vertical axis a refractive index n in the peripheral structure 42. Such distribution of refractive indexes can be realized by adjusting the growth conditions necessary for forming the periodic structure 42. For example, when a chemical compound semiconductor layer is crystal grown on the substrate 1, a "grating"structure that changes the composition of the semiconductor layer gradually may be realized by adjusting the refractive index distribution in a controlled manner.

Asymmetry of the optical characteristic of FIG. 4 corresponds to a braze angle of a diffraction grating and influences an intensity distribution of the radiation mode in the waveguide direction as in the phase shift, which is helpful in matching the active layer with a position where the intensity of the radiation mode is high.

(Third Embodiment)

An optical communication system having any one of the surface emitting lasers of FIGS. 1–3 will be described as a third embodiment.

Figure 5:
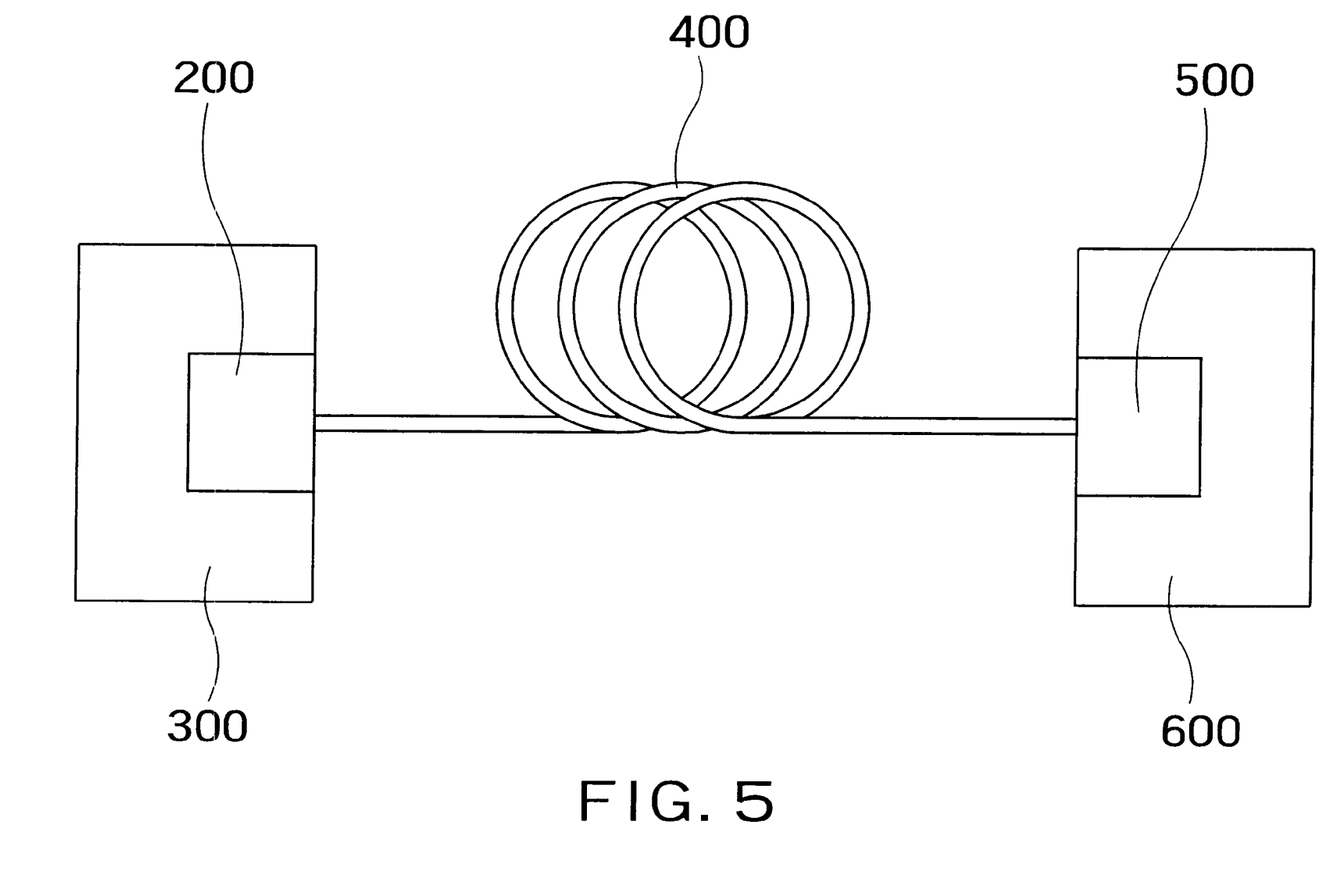
FIG. 5 schematically illustrates an optical communication system according to a third embodiment of the present invention.

FIG. 5 schematically illustrates a structure of the inventive optical communication system. This system comprises a light emitting element unit 200, a controller 300 therefor, an optical fiber 400, an photodetector unit 500, and a signal processor 600 provided after the photodetector unit 500 and including amplifying elements. The light emitting element unit 200 comprises the surface emitting laser of one of FIGS. 1–3.

In the FIG. 5 optical communication system, electrical signals are first sent to the light emitting element unit 200. These signals are then converted to a laser beam by the surface emitting laser of the light emitting element unit 200. The later beam from the surface emitting laser is sent via an optical fiber 400 to the photodetector unit 500 and reconverted to an electrical signal by a photodetecter of the photodetector unit 500. This electrical signal is amplified by the amplifying elements of the signal processor 600. As a result, the amplified electrical signal is extractable from the signal processor 600.

As described above, the surface emitting laser of one of FIGS. 1–3 used in the FIG. 5 optical communications system exhibits a good temperature characteristic, provides high output and is inexpensive. Thus, the use of this surface emitting laser in the light emitting element unit 200 serves to improve the performance of the FIG. 5 optical communication system and to reduce the whole cost.

While the FIG. 5 optical communication system mentioned above uses the light emitting element unit of the surface emitting laser of one of FIGS. 1–3, the surface emitting laser may be used as an optical amplifier or a wavelength selecting element of the photodetector. While the FIG. 5 optical communication system is illustrated as transmitting an optical signal, using the optical fiber 400, the optical signal may be transmitted over a space without using the optical fiber 400.

While in the above the embodiments of the present invention have been described, the present invention is not limited to those specified embodiments.

For example, while the use of the GaAlAs/GaAs materials has been illustrated in the above respective embodiments, the present invention can use various other appropriate materials to form corresponding lasers. Such appropriate materials comprise, for example, various chemical compound semiconductors for Groups III–v such as InGaAlP, InGaPAs, and BInGaAlN materials, chemical compounds for Groups II–IV such as ZnSe and ZnS materials, and semiconductors for Groups IV such as SiC.

The specified structures of the DBR, the periodic structure of the vertical cavity waveguide, the conductive area containing the active layer, and the electrode contacts used in the present invention may be replaced with other corresponding structures selected by those skilled in the art to produce advantageous effects similar to those produced by the above specified inventive structures. For example, the active layer may have a multiple quantum well type structure. The cladding layer may have a multiple quantum barrier structure.

The number and specified arrangement of those mechanisms can be appropriately determined by those skilled in the art to produce similar advantageous effects to those produced by the present invention. The present invention is applicable in various manners and expandable without departing from the spirit of the present invention.

What is claimed is:

1. A surface emitting laser comprising:
    a substrate;
    a vertical cavity of layers formed on said substrate for propagating and resonating light along an axis vertical to a surface of said substrate, said light emitted from an active layer by current injection; and
    a reflective film disposed concentrically with the vertical axis around the outer periphery of said vertical cavity for reflecting the light from said active layer in a horizontal direction parallel to the surface of said substrate,
    the light emitted from said active layer forming a laser beam due to resonation, which laser beam is then emitted in a vertical direction.

2. The surface emitting laser according to claim 1, wherein the light from said active layer are reflected by said reflective film to thereby resonate also in the horizontal direction.

3. The surface emitting laser according to claim 1, wherein said vertical cavity has a second-order or more optical periodicity along the vertical axis, and said light take the form of a radiation mode that propagates within said vertical cavity.

4. The surface emitting laser according to claim 3, wherein said vertical cavity further has a discontinuity in a phase of said periodicity.

5. The surface emitting laser according to claim 3, wherein said periodicity is asymmetrical along the vertical axis.

6. The surface emitting laser according to claim 1 further comprising:
    a phase modulator provided between said vertical cavity and said reflective film for controlling the phase of the light.

7. The surface emitting laser according to claim 1, wherein said vertical cavity comprises said active layer.

8. The surface emitting laser according to claim 1, wherein said active layer is provided between said vertical cavity and said reflective film.

9. An optical communication system comprising:
- a surface emitting laser comprising: a substrate; a vertical cavity of layers formed on said substrate for propagating and resonating along an axis vertical to a surface of said substrate, said light emitted from an active layer by current injection; and a reflective film disposed concentrically with the vertical axis around the outer periphery of said vertical cavity for reflecting the light from said active layer in a horizontal direction parallel to the surface of said substrate, the light emitted from said active layer forming a laser beam due to resonance and being emitted in a vertical direction;
- an optical fiber for transmitting the laser beam from said surface emitting laser therethrough; and
- a photodetector for receiving the laser beam from said optical fiber and for converting the laser beam to an electrical current.

10. A surface emitting laser comprising:
- a substrate;
- a first DBR formed on said substrate and taking the form of a cylinder having a central axis vertical to a surface of said substrate and exhibiting a high reflectivity to light having a wavelength of $\lambda$;
- a first conductive type cladding layer formed on an overall surface of said first DBR;
- an active layer formed on an overall surface of said first conductive type cladding layer for emitting light having a wavelength of $\lambda$ by current injection;
- a second conductive type cladding layer formed on an overall surface of said active layer;
- a second DBR taking the form of a cylinder formed on said second conductive type cladding layer and smaller in radius than said first DBR, said second DBR having the same central axis as said second conductive type cladding layer, said second DBR exhibiting a high reflectivity to the light having a wavelength of $\lambda$;
- said first DBR, said first conductive type cladding layer, said active layer, said second conductive type cladding layer, and said second DBR composing a vertical cavity;
- a burying layer of a second conductive type formed on said second conductive type cladding layer around the outer periphery of said second DBR, said burying layer exhibiting a lower refractive index than said second DBR;
- a reflective film covering the outer peripheries of said first DBR, said first conductive type cladding layer, said active layer, said second conductive type cladding layer, and said burying layer, said reflective film exhibiting a high reflectivity to the light having a wavelength of $\lambda$;
- the light from said active layer are resonated in a horizontal direction due to reflection of the light by said reflective film and focused in the vicinity of said central axis, the focused light are also resonated in a vertical direction by said vertical cavity to thereby form a laser beam, which is then extractable in the vertical direction from said second DBR.

11. The surface emitting laser according to claim 10 further comprising:
- a first electrode for injecting a current via said first conductive type cladding layer into said active layer; and
- a second ring-like electrode formed on said burying layer for injecting a current into said active layer via said burying layer and said second conductive type cladding layer.

12. The surface emitting laser according to claim 10, wherein said substrate is made of GaAs, each of said first and second DBRs comprising alternate layers of AlGaAs and AlAs, each of said first and second cladding layers being made of AlGaAs, said active layer being made of GaAs, said burying layer being made of GaAlAs.

13. The surface emitting laser according to claim 10, wherein said reflective film is made of an insulator.

14. The surface emitting laser according to claim 11, wherein said second electrode comprises a plurality of ring-like subelectrodes disposed concentrically.

15. A surface emitting laser comprising:
- a substrate;
- a cylindrical vertical cavity waveguide formed on said substrate and having a central axis vertical to said substrate, said waveguide comprising a lamination of alternate layers of different refractive indexes for causing light having a wavelength of $\lambda$ to resonate in a vertical direction;
- a cladding layer formed around the outer periphery of said vertical cavity waveguide on said substrate, said cladding layer exhibiting a smaller refractive index than an average refractive index of said vertical cavity waveguide;
- a conductive area formed around the outer periphery of said cladding layer on said substrate, said conductive area comprising a first conductive type cladding layer, an active layer formed on said first conductive type cladding layer for emitting light having a wavelength of $\lambda$ by current injection, and a second conductive type cladding layer formed on said active layer;
- a reflective film covering the outer periphery of said conductive area and exhibiting a high reflectivity to the light having a wavelength of $\lambda$;
- the light from said active layer are resonated in a horizontal direction and also in a vertical direction by said vertical cavity to thereby form a laser beam, which is then extractable in the vertical direction from said vertical cavity waveguide.

16. The surface emitting laser according to claim 15 further comprising:
- a first electrode for injecting a current via said first conductive type cladding layer into said active layer; and
- a second ring-like electrode formed on said conductive area for injecting a current into said active layer via said second conductive type cladding layer.

17. The surface emitting laser according to claim 15, wherein said substrate is made of GaAs, said vertical cavity waveguide comprising alternate layers of AlGaAs and AlAs, each of said first and second cladding layers is made of AlGaAs, and said burying layer is made of GaAlAs.

18. The surface emitting laser according to claim 15, wherein said reflective film is made of an insulator.

19. The surface emitting laser according to claim 15, wherein said vertical cavity waveguide comprises a phase shifter flush with said active layer for shifting by $\lambda/4$ the phase of light having a wavelength of $\lambda$ from said active layer.

20. The surface emitting laser according to claim 16, wherein said second electrode comprises a plurality of ring-like subelectrodes disposed concentrically.

* * * * *